United States Patent [19]

Hsue

[11] Patent Number: 4,877,971

[45] Date of Patent: Oct. 31, 1989

[54] METHOD AND APPARATUS FOR DISTRIBUTING A SIGNAL

[75] Inventor: Ching-Wen Hsue, Holland, Pa.

[73] Assignee: American Telephone and Telegraph Company, New York, N.Y.

[21] Appl. No.: 238,787

[22] Filed: Aug. 31, 1988

[51] Int. Cl.$^4$ .............................................. H02J 1/00
[52] U.S. Cl. ...................................................... 307/11
[58] Field of Search .............. 307/11; 379/55; 333/32, 333/33, 34

[56] References Cited

U.S. PATENT DOCUMENTS 3,697,895 10/1972 Beck ................................. 333/32 X
3,764,940 10/1973 Vergnolle ........................ 333/32 X Primary Examiner—William M. Shoop, Jr.
Assistant Examiner—Sharon D. Logna
Attorney, Agent, or Firm—R. B. Levy

[57] ABSTRACT

A network is disclosed for distributing a signal from a single source (18) to each of $2^n$ ($20_1$, $20_2$ ... $20_{2n}$ where n is an integer, such that the signals supplied to the loads each have substantially the same phase and amplitude. The network comprises $2^n$ paths ($22_1$, $22_2$ ... $22_{2n}$), each coupling the source to a separate one of the loads. Each path is comprised of $2n+1$ serially coupled segments ($24_1$, $24_4$ ... $24_{2n+1}$) with $2n-1$ of the segments ($24_1$, $24_4$ ... $24_{2n-1}$) of each branch being common to another path. The segments in each path have corresponding impedances ($Z_1$, $Z_2$ ... $Z_{2n+1}$), respectively, which are selected so that each load is substantially matched to the source and that the internal reflection of the signals within each path is minimized.

4 Claims, 3 Drawing Sheets

METHOD AND APPARATUS FOR DISTRIBUTING A SIGNAL

TECHNICAL FIELD

This invention relates to a technique for distributing a signal from a single source to a plurality of separate loads.

BACKGROUND ART

In many electronic systems, a single clock signal is split into a plurality of output signals for distribution to a plurality of circuits so each can operate in synchronism with the others. One technique for distributing a signal to a plurality of loads is to utilize a "daisy chain" network consisting of a single line having a plurality of outputs at spaced intervals therealong. A disadvantage of the daisy chain network is that when a signal is launched into a first end of the line, the signal at each output is progressively delayed by an interval proportional to the physical distance of the output from the first end of the line. The propagation delay suffered by each of the output signals can be critical, especially when the frequency of the clock signal exceeds 200 MHz. Thus the daisy chain network is not well suited for distributing a high-frequency clock signal to each of a plurality of loads where each load is to receive a signal having substantially the same amplitude and phase.

A single clock signal also may be distributed to a plurality of loads via a "cluster" network. A typical cluster network consists of a plurality of equal length lines, each carrying a signal from the source to each of the loads which are situated so as to lie along the locus of a circle. The cluster network, whose transmission lines resemble the spokes of a wheel, is often not suitable for many applications because of geometrical constraints. Moreover, as the number of lines within the cluster network increases, the characteristic impedance of each line, as seen by the signal source, decreases, causing a mismatch. The existence of a mismatch gives rise to signal reflections which will likely cause a significant distortion of the amplitude of each output signal.

Thus, there is a need for a technique for distributing a signal from a single source to each of a plurality of loads such that the signal supplied to each load has substantially the same amplitude and phase.

BRIEF SUMMARY OF THE INVENTION

Briefly, in accordance with the invention, a network is provided for distributing a signal from a single source to each of $2^n$ loads, where n is an integer $\geq 0$, such that the signals supplied to the loads each have substantially the same phase and amplitude. The network comprises $2^n$ paths, each coupling the source to a separate one of the loads. Each path is comprised of $2n+1$ serially coupled segments $L_1, L_2 \ldots L_{2n+1}$ with each of the segments $L_1, L_2 \ldots L_{2n-1}$ of each path being common to another path. The segments $L_1, L_2 \ldots L_{2n+1}$ in each path have corresponding inpedances $Z_1, Z_2 \ldots Z_{2n+1}$, respectively, which are selected so that each load is substantially matched to the source and that internal reflection of the signals within each path is minimized.

In a preferred embodiment, the segment impedances are obtained by first selecting values which satisfy the following relationships:

$$\frac{Z_1}{Z_s + Z_1} \frac{2Z_2}{Z_1 + Z_2} \cdots \frac{2Z_{2n+1}}{Z_{2n+1} + Z_L} = \frac{Z_s}{Z_s + Z_L} \quad (1)$$

and $$\left( \sum_{i=0}^{2n} \frac{Z_{i+1} - Z_i}{Z_{i+1} + Z_i} \frac{Z_{i-1} - Z_i}{Z_{i-1} + Z_i} \right) \prod_{j=1}^{2n} \frac{2Z_{j+1}}{Z_{j+1} + Z_j} = 0 \quad (2)$$

where $Z_s$ and $Z_L$ are the impedance of the source and each of the $2^n$ loads, respectively. Thereafter, each of the values is scaled in accordance with the number of paths common to the corresponding segment.

It is not possible to first select a unique value for the impedances $Z_1, Z_2 \ldots Z_{2n+1}$ of the segments $L_1, L_2 \ldots L_{2n+1}$, respectively, using Eqs. (1) and (2). Rather, the impedances $Z_1, Z_2 \ldots Z_{2n-1}$ of the segments $L_1, L_2 \ldots L_{2n-1}$, respectively, can be arbitrarily chosen, and the initial values for the impedances $Z_{2n}$ and $Z_{2n+1}$ are obtained using Eqs. (1) and (2). Thereafter the values must be scaled as described. In selecting the initial values for the impedances $Z_1 Z_2 \ldots Z_{2n-1}$, care must be taken so the final set of impedances $Z_1, Z_2 \ldots Z_{2n+1}$ for the segments $L_2, L_2 \ldots L_{2n+1}$, respectively, is physically realizable.

In applications where a high-frequency digital clock signal is to be supplied to each of a plurality of electrical circuits, the network of the present invention can be realized on a printed circuit board. Each path of the network is comprised of $2n+1$ serially connected metallized areas, each having a width and length such that each load is matched to the source.

DETAILED DESCRIPTION

Figure 1:
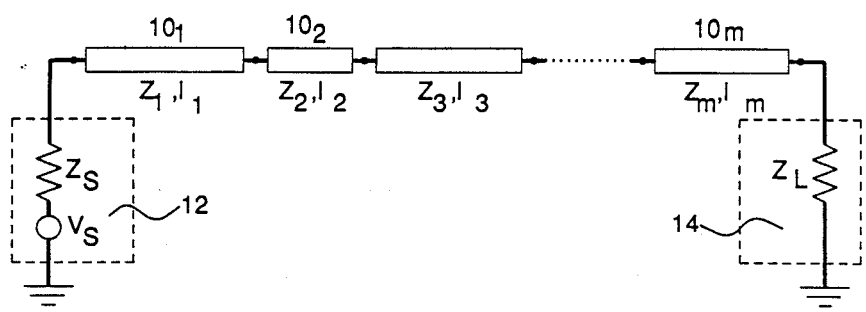
FIG. 1 shows a block schematic diagram of an m-section transmission line which couples a signal source to a load.

To appreciate the details of the present invention, a general understanding of transmission lines will prove helpful. In this regard, reference should be made to FIG. 1, which illustrates a conventional, prior art transmission line 10 coupled between a voltage source 12 and a load 14. As shown, the transmission line 10 is comprised of m individual segments (where m is an integer) $10_1, 10_2 \ldots 10_m$, whose length and impedance are given by a corresponding one of the terms $L_1, L_2 \ldots L_m$, and $Z_1, Z_2 \ldots Z_m$, respectively. The source 12 and the load 14 have associated impedances $Z_s$ and $Z_L$, respectively.

Depending on the degree of impedance mismatch between the transmission line 10 and the source 12, a step pulse entering the line from the source will be partly reflected back to the source and partly transmitted to the load 12. Within the transmission line 10, an impedance mismatch between each of the individual segments $10_1, 10_2 \ldots 10_m$ will cause the signal passing from the segment $10_i$ to the segment $10_{i+1}$ to be partially reflected and partially transmitted. The magnitude of the signal received at the load 14, as measured over time, equals the summation of all the signal components which successively arrive at the load. If each of the segments $10_1, 10_2 \ldots 10_m$ is assumed to be loss-less, then the magnitude of the voltage, $V_{out}$ arriving at the load, will be given by $$V_{out}(t) = V_s \tau_{0,1} \tau_{1,2} \ldots \tau_{m,m+1} u(t - T_{line}) \quad (3)$$

$$\left[ 1 + \sum_{i=0}^{m-1} \sum_{j=i+1}^{m} \gamma_{j,j+1} \gamma_{i+1,i} \prod_{k=i+1}^{j-1} (\tau_{k,k+1} \tau_{k+1,k}) \cdot \right.$$

$$\left. u\left(t - T_{line} - 2 \sum_{k=i+1}^{j} T_k\right) + \ldots \right]$$

where:

$$\tau_{0,1} = \frac{Z_1}{Z_0 + Z_1} \quad (4)$$

$$\tau_{i,i+1} = \frac{2Z_i + 1}{Z_{i+1} + Z_i} \text{ for } i \geq 1 \quad (5)$$

$$\gamma_{i,i+1} = \tau_{i,i+1} - 1 \text{ for } i \geq 1 \quad (6)$$

$$T_i = \frac{l_i}{v_i} \quad (7)$$

$$T_{line} = \sum_{i=1}^{m} T_i \quad (8)$$

and:

$V_s$ is the magnitude of the pulse produced by the source, u(t) is the unit step function representing the pulse;

$v_i$ is the velocity of the signal propagating through the element $10_i$, $T_i$ is the time required for the pulse to propagate through the segment $10_i$;

$\tau_{i,i+1}$ is the transmission coefficient for the signal propagating from the segment $10_i$ to the segment $10_{i+1}$; and $\gamma_{i,i+1}$ is the reflection coefficient for the signal reflected back from the segment $10_i$ at the interface of the segment $10_{i-1}$.

The double summation term in Eq. (3) represents the contribution of those portions of the signal pulse which undergo a twofold reflection before arriving at the load 14. It should be understood that portions of the signal component may undergo more than two reflections but that these higher order reflections are not represented in Eq. (3) for purposes of simplicity. To appreciate the complexity of accounting for higher order refections, Eq. (9) contains all of the terms necessary to account for those portions of the signal which undergo a fourfold reflection.

Figure 2:
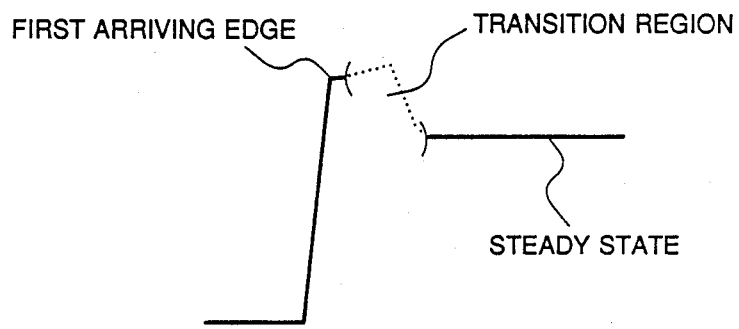
FIG. 2 shows a waveform of the signal from the signal source of FIG. 1 as it appears at the load.

Referring now to FIG. 2, there is shown a waveform of the pulse from the source 12 as it appears at the load 14. The waveform of FIG. 2 is comprised of a forward edge, a transition region and then a region where the waveform has a steady state. The voltage magnitude of the first edge may be larger or smaller than the steady state voltage which is solely determined by the impedances $Z_1, Z_2 \ldots Z_m$ of the elements $10_1, 10_2 \ldots 10_m$, respectively.

When the width of the pulse produced by the source 12 is on the order of the width of the transition region, then any ripples present in the transition region will lead to distortion in the signal reaching the load 14. To eliminate such ripples, the voltage difference between the first arriving edge and the steady state portion of the pulse must be eliminated. This can be accomplished by selecting the impedances $Z_1, Z_2 \ldots Z_m$ such that $Z_1 = Z_2 = Z_3 = \ldots Z_m = Z_L$. Under these conditions, the voltage magnitude of the arriving edge will equal the steady state voltage magnitude.

Eliminating the voltage difference between the first arriving edge and the steady state portion of the signal of FIG. 2 may not eliminate ringing within the transition portion caused by internal signal reflections between the segments $10_1, 10_2 \ldots 10_m$. The physical processes associated with the internal reflections within the line 10 are very involved, making it difficult to draw any useful insight from the mathematical expressions describing such reflections. However, by judicious selection of the impedances $Z_1, Z_2 \ldots Z_m$ of the segments $10_1, 10_2 \ldots 10_m$, respectively, the components of the signal in the transmission line 10 which undergo mulitiple reflections can be made to cancel each other out.

In order to obtain a simple analytical formula which allows the impedances $Z_1, Z_2 \ldots Z_m$ to be optimized, it will be useful to assume that each of the segments $10_1, 10_2 \ldots 10_m$ of the line 10 has the same electrical length. Therefore, each of the segments $10_1, 10_2 \ldots 10_m$ is assumed to have the same propagation delay T. Thus, the components of the signal launched into the line 10 which undergo a twofold reflection at both ends of the line arrive at the same time. In order to eliminate the ripple wave which arrives 2T after the first wave, the sum of these two signals is set equal to zero, yielding:

$$\left( \sum_{i=1}^{m} \frac{Z_{i+1} - Z_i}{Z_{i+1} + Z_i} \frac{Z_{i-1} - Z_i}{Z_{i-1} + Z_i} \right) \prod_{j=1}^{m} \frac{2Z_{j+1}}{Z_{j+1} + Z_j} = 0 \quad (10)$$

If we also impose the requirement that the voltage magnitude of the first arriving edge be the same as the steady state magnitude, then the following relationship must be satisfied:

$$\left[ \sum_{i=1}^{m} \left( \frac{Z_{i+1} - Z_i}{Z_{i+1} + Z_i} \right)^2 \left( \frac{Z_{i+1} - Z_i}{Z_{i-1} + Z_i} \right)^2 \right] \prod_{j=1}^{m} \frac{2Z_{j+1}}{Z_{j+1} + Z_j} + \quad (9)$$

$$\left[ \sum_{i=1}^{m-1} \frac{Z_{i+2} - Z_{i+1}}{Z_{i+2} + Z_{i+1}} \frac{Z_{i-1} - Z_i}{Z_{i-1} + Z_i} \frac{2Z_{i+1}}{Z_i + Z_{i+1}} \frac{2Z_i}{Z_i + Z_{i+1}} \right] \prod_{j=1}^{m} \frac{2Z_{j+1}}{Z_{j+1} + Z_j} = 0$$

Generally it is only necessary to account for the twofold signal reflections in order to accurately model the transmission line 10. Only those portions of the signals from the source 12 which undergo an even number of reflections arrive at the load 14.

$$\frac{Z_1}{Z_0 + Z_1} \frac{2Z_2}{Z_1 + Z_2} \frac{2Z_3}{Z_2 + Z_3} \ldots \quad (11)$$

$$\frac{2Z_{m+1}}{Z_m + Z_{m+1}} = \frac{Z_{m+1}}{Z_0 + Z_{m+1}}$$

Equations (10) and (11) contain m unknown quantities, namely, $Z_1, Z_2 \ldots Z_m$. Therefore, there is no unique solution for $Z_1, Z_2 \ldots Z_m$. To arrive at a solution, arbitrary values are assigned to each of $m-2$ of the impedances $Z_1, Z_2 \ldots Z_m$ while the remaining two impedances are computed in accordance with Eqs. (10) and (11).

It is possible to use the technique thus described to eliminate the ripple caused by higher order reflected signals. However, as indicated, the mathematical relationship for each higher order signal is far more complex. For most practical applications, elimination of the first order reflected signal will serve to assure that a high-quality output signal is present at the load 14.

Figure 3:
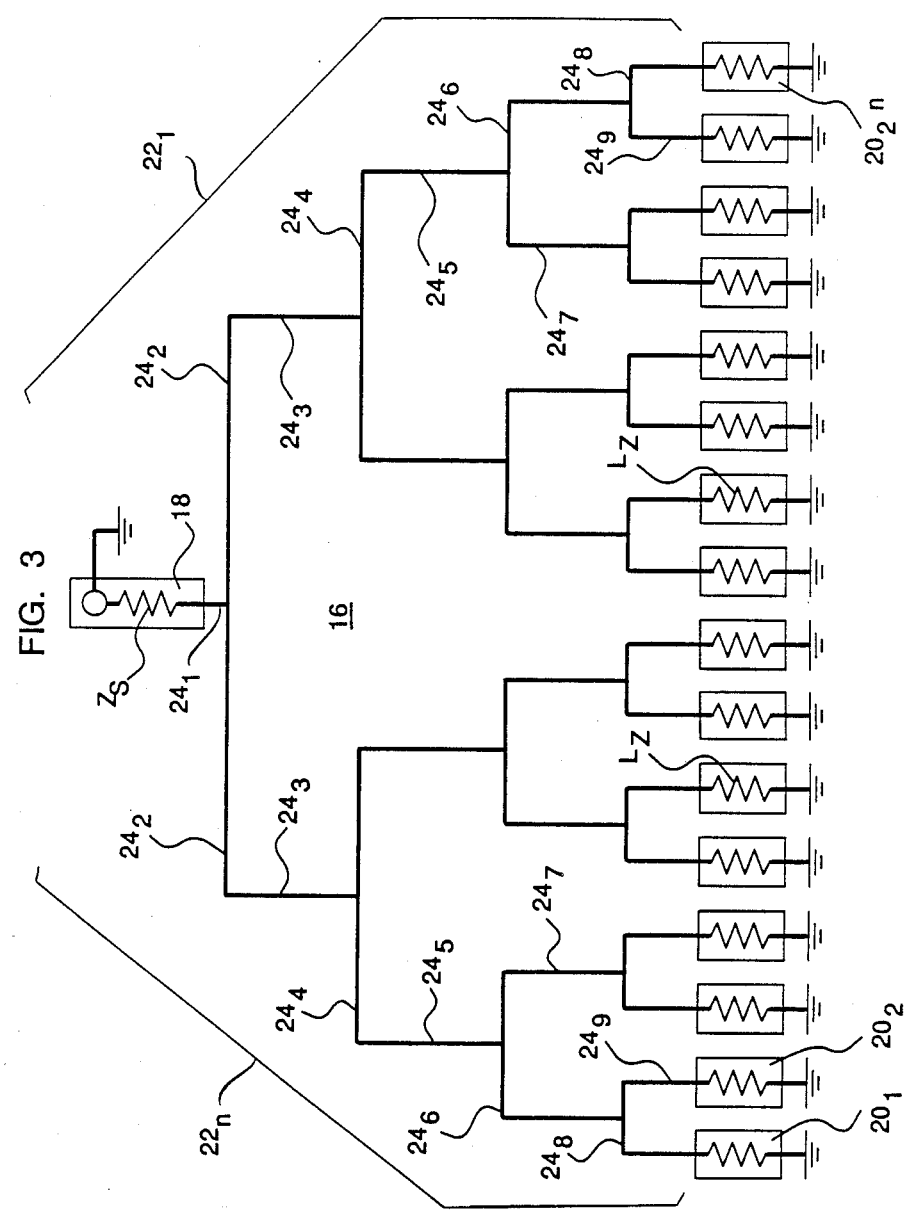
FIG. 3 shows a block schematic diagram of a network in accordance with the present invention.

FIG. 3 shows a schematic diagram of a network 16, in accordance with the invention, for distributing a signal from a source 18 to $2^n$ (where n is an integer $\geq 0$) loads $20_1, 20_2 \ldots 20_{2n}$, such that the signals supplied to the loads have substantially the same phase and amplitude. In a preferred embodiment, n=4, so that the network 16 connects the source 18, which has an internal impedance of $Z_s$, to each of sixteen separate loads $20_1, 10_2 \ldots 10_{16}$, each having an impedance $Z_L$.

The network 16 comprises $2^n$ path, $22_1, 22_2 \ldots 22_{2n}$, each path comprised of $2n+1$ individual segments $24_1, 24_2 \ldots 24_{2n+1}$. All of the paths $22_1, 22_2 \ldots 22_{2n}$ have the segment $24_1$ in common with each other. Further, the segments $24_1, 24_2 \ldots 24_{2n-1}$ of each of the paths $22_1, 22_2 \ldots 22_{2^n}$ are common to an adjacent paths. For example, when n=4, there will be sixteen individual paths $22_1, 22_2, 22_3, 22_4, 22_5, 22_6, 22_7, 22_8, 22_9, 22_{10}, 22_{11}, 22_{12}, 22_{13}, 22_{14}, 22_{15}$, and $22_{16}$, each linking a separate one of the loads $20_1 \ldots 20_{16}$, respectively, to the source 18. The first path $22_1$ is comprised of the segments $24_1, 24_2, 24_3, 24_4, 24_5, 24_6, 24_7, 24_8$, and $24_9$. The second path $22_2$ is also comprised of the segments $24_1, 24_2, 24_3, 24_4, 24_5, 24_6, 24_7, 24_8$, and $24_9$ with the segments $24_1 \ldots 24_7$ being in common with the path $22_1$. The paths $22_3 \ldots 22_{26}$ are each likewise comprised of the segments $24_1 \ldots 24_9$, with the segments $24_1 \ldots 24_7$ of each path being in common with the same segments of an adjacent path. The network 16 is realized by cascading $2^n - 1$ split T junctions, each having an input leg which forms a segment $24_i$ common to at least a pair of paths $22_i$ and $22_{i+1}$, and a pair of output legs, each forming the segment $24_{i+1}$ of a separate one of two adjacent paths where $i = 1, 2, 3 \ldots 2^n$.

As may be appreciated, each of the paths $22_1, 22_2 \ldots 22_{2n}$ can be thought of as a $2n=1$ segment transmission line having electrical characteristics identical to the transmission line 10 of FIG. 1. Thus, it is possible to use equations (10) and (11) to establish the impedances $Z_1, Z_2 \ldots Z_{2n+1}$. However, it should be recognized that when employing the equations (10) and (11), the segments $24_1, 24_2 \ldots 24_{2n-1}$ are common to the branches $22_1 - 22_{2n-1}, 22_2 - 22_{2n-1}, \ldots 22_{2n-1} - 22_{2n-1}$. To account for this fact, it is necessary, when selecting values for the impedances of the segments $24_1, 24_2 \ldots 24_{2n-1}$ to use values which have been scaled relative to the impedances $Z_1 - Z_n$ of the line 10. The scaling is dependent on the number of paths $22_1, 22_2 \ldots 22_{2n}$ to which each of the segments $24_1, 24_2 \ldots 24_{2n-1}$ is common. For example, if a given value x has been chosen for the impedance $Z_1$ of the segments $24_1$ to satisfy Eqs. (10) and (11), then the proper scaling factor will be $\frac{1}{2}^n$ to account for the fact that the segments $24_1$ is common to all of the $2^n$ paths $22_1, 22_2 \ldots 22_{2n}$. In a similar manner, the scaling factor for the impedance $Z_2$ of the segments $24_2$ which is common to $2^{n-1}$ of the paths is $\frac{1}{2}^{n-1}$.

It should be noted that Eqs. (10) and (11) do not uniquely prescribe the impedances $Z_1, Z_2 \ldots Z_{2n+1}$ of the segments $24_1, 24_2 \ldots 24_{2n+1}$, respectively, for the same reason that the equations to not uniquely prescribe the impedances $Z_1, Z_2 \ldots Z_m$ for the segments $10_1, 10_2 \ldots 10_m$ of FIG. 1. Rather, when constructing the network 16, all but two of the impedances $Z_1, Z_2 \ldots Z_{2n+1}$ are arbitrarily selected, with the remaining two impedances being determined using Eqs. (10) and (11). Thereafter, the values are scaled as required. The only constraint on selecting $2n-1$ of the impedances $Z_1, Z_2 \ldots Z_{2n+1}$ is that all the impedances $Z_1, Z_2 \ldots Z_{2n+1}$ must be physically realizable.

Figure 4:
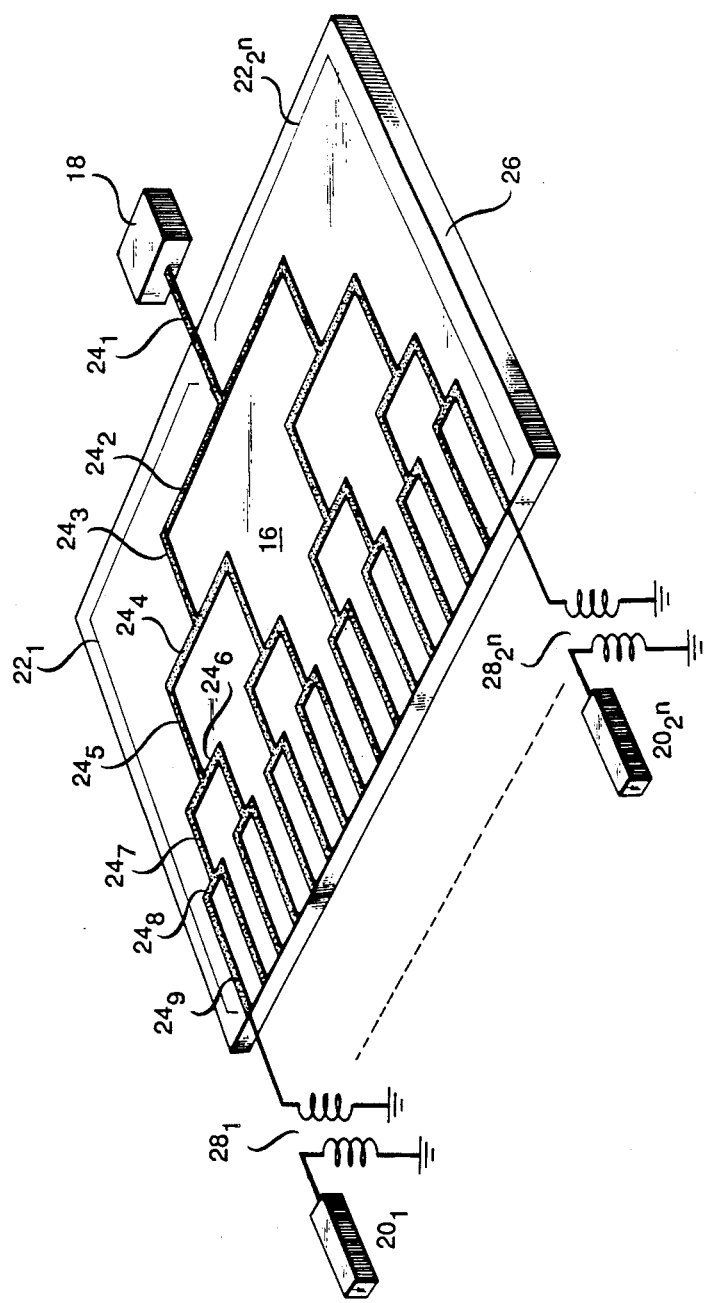
FIG. 4 is an example of how the network of FIG. 4 may be realized in a printed circuit board.

Referring to FIG. 4, the network 16 of FIG. 3 may be physically realized on a printed circuit board 26. The segments $24_1, 24_2 \ldots 24_{2n+1}$ of each of the paths $22_1, 22_2 \ldots 22_{2n}$ of the network 16 shown in FIG. 4 take the form of metallized paths on the circuit board 26 which are connected in series to form each path. The width and the length of the metallized paths which form the segments $24_1, 24_2 \ldots 24_{2n+1}$ in each path are such that the impedances $Z_1, Z_2 \ldots Z_{2n+1}$, prior to scaling, satisfy Eqs. (10) and (11). Rather than directly connect the segment $24_{2n+1}$ of each of the paths $22_1, 22_2 \ldots 22_{2n}$ to a separate one of the loads $20_1, 20_2 \ldots 20_{2n}$, each of a set of coupling transformers $28_1, 28_2 \ldots 28_{2^n}$ is interposed between the segment and the load to achieve a closer impedance match. Table 1 below lists an exemplary set of impedance values for the segments $24_1, 24_2 \ldots 24_9$ of each of the sixteen paths $22_1, 22_2 \ldots 22_{16}$ of the network 16 on the circuit board 26 when the source 18 and the loads $20_1, 20_2 \ldots 20_{16}$ have a characteristic impedance of 50 ohms, and the transformers $28_1, 28_2 \ldots 28_{16}$ input and output impedance of 150 and 50 ohms, respectively.

TABLE 1

| | |
|---|---|
| $Z_1$ | 10 |
| $Z_2, Z_3$ | 17.5 |
| $Z_4, Z_5$ | 25 |
| $Z_6, Z_7$ | 17 |
| $Z_8, Z_9$ | 50 |

As may now be appreciated, the network 16 of the present invention has several advantages over the daisy chain and cluster networks of the prior art. First, each of the paths $22_1, 22_2 \ldots 22_{2n}$ has the same electrical length which virtually eliminates propagation delays. Secondly, because the network 16 is arranged in a tree-like structure, with each of its paths $22_1, 22_2 \ldots 22_{2n}$ having one or more of its links $24_1, 24_2 \ldots 24_{2n+1}$ in common, impedance mismatches between the source 18 and each of the loads $20_1, 20_2 \ldots 20_{2n}$ are reduced, as compared to the prior art cluster network.

It is to be understood that the above-described embodiments are merely illustrative of the principles of the invention. Various modifications and changes may be made thereto by those skilled in the art which will embody the principles of the invention and fall within the spirit and scope thereof. For example, while the network 16 has been described in connection with distributing electrical signals, the network could also be utilized to distribute other types of electromagnetic radiation, provided that the paths $22_1, 22_2 \ldots 22_{2n}$ and the segments $24_1, 24_2 \ldots 24_{2n+1}$ are suitably configured.

What is claimed is:

1. A network for distributing a signal from a single source to $2^n$ loads (where n is an integer $\geq 0$), consisting of $2^n$ paths of approximately the same electrical length, each coupling a source to a separate one of the loads, the paths each consisting of $2n+1$ serially connected segments $L_1, L_2 \ldots L_{2n+1}$, respectively, with the segments $L_1, L_2 \ldots L_{2n-1}$ of each path being common to another of the paths, the segments $L_1, L_2 \ldots L_{2n+1}$ having corresponding impedances $Z_1, Z_2 \ldots Z_{2n+1}$, respectively, which are selected such that each load is substantially matched to the source and the internal signal reflections within the branch are minimized.

2. The network according to claim 1, CHARACTERIZED IN THAT the impedances $Z_1, Z_2 \ldots Z_{2n+1}$ of the segments $L_1, L_2 \ldots L_{2n+1}$ are determined by first selecting values therefor which satisfy:

$$\left( \sum_{i=1}^{2n} \frac{Z_{i+1} - Z_i}{Z_{i+1} + Z_i} \frac{Z_{i-1} - Z_i}{Z_{i-1} + Z_i} \right) \prod_{j=1}^{2n} \frac{2Z_{j+1}}{Z_{j+1} + Z_j} = 0 \quad (10)$$

$$\frac{Z_1}{Z_0 + Z_1} \frac{2Z_2}{Z_1 + Z_2} \frac{2Z_3}{Z_2 + Z_3} \cdots \frac{2Z_{2n+1}}{Z_{2n} + Z_{2n+1}} = \quad (11)$$

$$\frac{Z_{2n+1}}{Z_0 + Z_{2n+1}}$$

and then scaling the value by the number of paths which are common to the coresponding segments.

3. The network according to claim 1, wherein each network comprises a printed circuit board with each of the segments $L_1, L_2 \ldots L_{2n+1}$ of each of the $2^n$ paths being a separate one of a plurality of metallized areas on the circuit board.

4. An interconnection apparatus for connecting a source of electrical signals to each of $2^n$ (where n is an integer $\geq 0$) electrical loads, consisting of:

a substrate having a network of metallized paths formed thereon, the netowrk containing only $2^n$ paths each path being of approximately the same electrical length and comprised of only $2n+1$ serially connected metallized segments $L_1, L_2 \ldots L_{2n+1}$, the segments $L_1, L_2 \ldots L_{2n-1}$ of each path being common to another path, the segments $L_1, L_2 \ldots L_{2n+1}$ within each path being of an impedance $Z_1, Z_2 \ldots Z_{2n+1}$, respectively, such that each load is substantially matched to the source and there is no substantially internal reflection of signals within each path.

* * * * *